(12) United States Patent
Nguyen

(10) Patent No.: US 6,501,315 B1
(45) Date of Patent: Dec. 31, 2002

(54) HIGH-SPEED FLIP-FLOP OPERABLE AT VERY LOW VOLTAGE LEVELS WITH SET AND RESET CAPABILITY

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/020,369

(22) Filed: Dec. 12, 2001

(51) Int. Cl.[7] .................................................. H03K 3/12
(52) U.S. Cl. ........................ 327/217; 327/203; 327/208; 327/211
(58) Field of Search .................................. 327/199, 202, 327/203, 208, 209, 210, 211, 212, 214, 217, 218, 225

(56) References Cited

U.S. PATENT DOCUMENTS 5,570,051 A * 10/1996 Chiang et al. ............... 327/203
5,939,915 A * 8/1999 Curran ........................ 327/202
6,380,780 B1 * 4/2002 Aitken et al. ................ 327/202

* cited by examiner

Primary Examiner—Timothy P. Callahan
Assistant Examiner—An T. Luu
(74) Attorney, Agent, or Firm—Lois D. Cartier

(57) ABSTRACT

Flip-flops both operable at high speed and reliable at low voltage levels. A first flip-flop includes first and second cross-coupled latches. Whenever a high value is passed to one node of a latch in the flip-flop, a low value is passed to the other node of the latch. Therefore, the latches can safely ignore all high input values, which permits the flip-flops of the invention to function at very low voltages. Because writing a high value is normally slower than writing a low value, the flip-flops of the invention also function at very high clock rates, even at very low voltages. In some embodiments, pull-ups and pull-downs are coupled directly to the nodes of the latches, enabling the use of inverters instead of NAND and NOR gates to implement set and reset flip-flops, and thereby increasing the operating frequency of these flip-flops.

27 Claims, 12 Drawing Sheets

HIGH-SPEED FLIP-FLOP OPERABLE AT VERY LOW VOLTAGE LEVELS WITH SET AND RESET CAPABILITY

FIELD OF THE INVENTION

The invention relates to the sequential storage circuits commonly referred to as "flip-flops". More particularly, the invention relates to a high-speed flip-flop that operates at very low voltage levels and can offer set and/or reset capability.

BACKGROUND OF THE INVENTION

Flip-flops are sequential circuits storing either a "high" value (power high, or logic one) or a "low" value (power low, or logic zero). A flip-flop has a next value that depends on the values of one or more input signals. Conventionally, a flip-flop has data, clock, set, and/or reset input signals.

A D (data) input signal is typically clocked into the flip-flop on receipt of a given clock edge, and appears at the flip-flop output on the opposite clock edge. S (set) and R (reset) input signals are generally unclocked, meaning that when the set or reset signal becomes active (e.g., goes high), the stored value changes immediately, without waiting for the arrival of a clock edge. An active set signal forces the stored value (conventionally designated Q) high, no matter what value was previously stored. An active reset signal forces the stored value Q low, no matter what value was previously stored. In set/reset flip-flops (i.e., flip-flops having both set and reset input signals) the set and reset signals are typically restricted such that at most one of them can be active at any given time.

Flip-flops are often designed using two latches separated by passgates. FIG. 1 shows such a flip-flop, comprising a first latch including cross-coupled inverters 101 and 102, a second latch including cross-coupled inverters 103 and 104, and passgates 106, 107. The clock signal C is inverted by inverter 105 to provide inverted clock signal CB. On the falling edge of the clock signal C (or whenever signal C is low), signal CB goes high, and the data signal D passes through passgate 106 to node A, and hence into the first latch. (In the present specification, the same reference characters are used to refer to terminals, signal lines, and their corresponding signals.) The data value is inverted by inverter 101, and appears at node B. On the next rising edge of clock signal C, the inverted data from node B passes through passgate 107 to node QB (the inverted output signal), and hence into the second latch. The data is again inverted by inverter 103, and appears on the output node Q.

For the flip-flop to function properly, it must be possible to write a high value to each of nodes A and QB, and ensure that the new value overcomes a low value previously stored on the node. The new high value must pass through either passgate 106 or passgate 107, and overcome the zero value being provided by inverter 102 or inverter 104, respectively. When passing through an N-channel transistor, a high voltage value is reduced by the threshold voltage of the transistor. Therefore, if an N-channel transistor is used to implement the passgate, as shown in FIG. 1, inverters 102 and 104 are necessarily designed to be weak, and correspondingly slow. (Writing low values is not an issue, because there is no voltage degradation of a low signal through an N-channel transistor.)

At very low voltages, the high voltage value (VDD) approaches the threshold voltage of an N-channel transistor, which is generally about 0.7 volts. It is not practical to reduce this threshold voltage, because transistors with a lower threshold voltage would become unacceptably sensitive to noise. Therefore, at very low voltages, the high value passed through the passgate is not sufficient to overcome even a weak inverter (e.g., inverter 102 in FIG. 1), and therefore may not be high enough to trip inverter 101. The same limitation applies to passgate 107 and inverters 104, 103. One known solution is to implement the passgates using CMOS passgates (i.e., paired N-channel and P-channel transistors), as shown in FIG. 2.

FIG. 2A shows a well-known flip-flop similar to that of FIG. 1. The N-channel transistors forming passgates 106, 107 in FIG. 1 are replaced by CMOS passgates 206, 207, respectively. The P-channel gate terminals are driven by the inverse of the signals used to drive the N-channel gate terminals. A high value on data input D or node B is not reduced as it passes through the P-channel transistor. Therefore, the substitution of the CMOS passgates for the simple N-channel transistors ensures that new high values will be successfully latched, even at low voltages. (Of course, the high voltage level must be higher than the threshold voltage of the N-channel transistor, or no circuit containing N-channel transistors will function properly.)

A disadvantage of using CMOS passgates in flip-flops is that P-channel transistors are relatively slow compared to similarly-sized N-channel transistors. Because flip-flops are ubiquitous in nearly all integrated circuits, minimum sized gates are usually used to implement flip-flops. Passing a high logic level through a minimum sized P-channel transistor introduces a delay that can become significant.

Therefore, the flip-flop of FIG. 2A also includes another modification, which improves the operating speed of the flip-flop. CMOS passgates 208 and 209 are inserted into the latch feedback loops after inverters 202 and 204, respectively. When clock signal C goes low and inverted clock signal CB goes high, CMOS passgate 206 is turned on. In the flip-flop of FIG. 1, an incoming high data signal must then overcome a low value on node A driven by inverter 102. In the flip-flop of FIG. 2A, however, passgate 208 is turned off (because clock signal C is low), and there is no driving inverter to be overcome by the new high value. Similarly, when clock signal C goes high and inverted clock signal CB goes low, passgate 209 is turned off, and a high value on node B passes onto node QB unopposed by inverter 204. Thus, the latches in FIG. 2A change state more rapidly than the corresponding latches in FIG. 1.

FIG. 2B shows another prior art flip-flop similar to that of FIG. 2A. In the flip-flop of FIG. 2A, passgates (208, 209) are inserted between the outputs terminals of the feedback inverters (202, 204) in the latches and the nodes (A, QB) by which data is passed to the latches. These passgates provide a means for electrically isolating the feedback inverters from the nodes when new data is provided to the latches. However, writing a low value to a latch is generally not a problem, even at low voltages. The problems are encountered only when writing a high value to the latch while overcoming a low value provided by the feedback inverter. Therefore, when writing any new value to the latch, it is only necessary to prevent the feedback inverter from driving a low value.

In the flip-flop of FIG. 2B, P-channel transistor 211 and N-channel transistor 213 form an inverter driven by node B (corresponding to inverter 202 in FIG. 2A). Inserted into the pull-down path of the inverter is an N-channel transistor 212 gated by the clock signal C. Thus, when clock signal C goes low, the new data (e.g., a high value) is written from data input terminal D to node A. Because clock signal C is low, no low signal is provided through N-channel transistor 213. Therefore, the new high value on node A is unopposed.

Similarly, P-channel transistor 221 and N-channel transistor 223 form an inverter driven by node Q (corresponding to inverter 204 in FIG. 2A). Inserted into the pull-down path of the inverter is an N-channel transistor 222 gated by inverted clock signal CB. Thus, when clock signal C goes high, the new data (e.g., a high value) is written from node B to node QB. Because inverted clock signal CB is low, no low signal is provided through N-channel transistor 223. Therefore, the new high value on node QB is unopposed.

It is possible to include feedback passgates 208 and 209 (FIG. 2A) or N-channel transistors 212 and 222 (FIG. 2B) while using N-channel transistors 106 and 107 (FIG. 1) instead of CMOS passgates 206 and 207 (FIGS. 2A and 2B) to feed the latches. Eliminating the feedback paths while writing to nodes A and QB gives improved performance compared to the flip-flop of FIG. 1. However, as described above, at very low voltages an incoming high value can be reduced below the threshold voltage of the N-channel device in the latch inverter. For example, if the power high voltage is 1.4 volts and the threshold voltage of an N-channel device is 0.7 volts, the high voltage after passing through N-channel transistor 106 or 107 is only 0.7 volts, which might or might not be sufficient to trip the latch. When processing variations are taken into account, the flip-flop becomes unreliable even at voltages higher than 1.4 volts. Therefore, the use of N-channel transistors to implement passgates 106 and 107 is not desirable for known flip-flop circuits expected to operate at low voltages.

While CMOS passgates 206 and 207 are necessary to ensure functionality at low voltages, the P-channel transistors included in the passgates still introduce undesirable delay into the data path through the flip-flop when writing high values over low values previously stored in nodes A or QB.

The issue of speed becomes more problematical when reset and/or set capability is added to the flip-flop. FIG. 3 shows a well-known flip-flop similar to that of FIG. 2A, but having reset capability. The reset signal R is inverted through inverter 310 to provide inverted reset signal RB. Inverter 201 is replaced with NAND gate 301, and the second input terminal of NAND gate 301 is driven by inverted reset signal RB. Inverter 203 is replaced with NOR gate 303, and the second input terminal of NOR gate 303 is driven by reset signal R.

Thus, when signal R goes high, signal RB goes low and node B is forced to a high value, while the output signal Q is forced to a low value. Both values are latched through the respective feedback loops.

The reset flip-flop of FIG. 3 is slower than a corresponding flip-flop without reset capability, because of the extra transistors included in NAND gate 301 and NOR gate 303. Assume that reset signal R is inactive (deasserted, or low) and signal RB is high. Whenever a high value is written from data input D to node A, node B goes low. However, node B is now pulled low through two N-channel transistors in series. (See FIG. 3A, which shows a standard CMOS NAND-gate that includes two N-channel transistors 313, 314 coupled in series and two P-channel transistors 311, 312 coupled in parallel.) Therefore, NAND gate 301 is slower than inverter 201.

Similarly, whenever a low value is written from node B to node QB, output node Q goes high (assuming the reset signal R is inactive). However, output node Q is now pulled high through two P-channel transistors in series. (See FIG. 3B, which shows a standard CMOS NOR-gate that includes two P-channel transistors 315, 316 coupled in series and two N-channel transistors 317, 318 coupled in parallel.) Therefore, NOR gate 303 is slower than inverter 203.

FIG. 4 shows a well-known flip-flop similar to that of FIG. 2A, but having set capability. The set signal S is inverted through inverter 460 to provide inverted set signal SB. Inverter 201 is replaced with NOR gate 401, and the second input terminal of NOR gate 401 is driven by set signal S. Inverter 203 is replaced with NAND gate 403, and the second input terminal of NAND gate 403 is driven by inverted set signal SB.

Thus, when signal S goes high, node B is forced to a low value, signal SB goes low, and the output signal Q is forced to a high value. Both values are latched through the respective feedback loops.

Similar to the reset flip-flop of FIG. 3, the set flip-flop of FIG. 4 is slower than a corresponding flip-flop without set capability, because of the extra transistors included in NOR gate 401 and NAND gate 403.

It is part of the nature of transistors that, all else being equal, a lower voltage means a slower operating speed. At one time, virtually all integrated circuits operated at 5 volts. However, voltage levels of integrated circuits have been rapidly decreasing, first to 3.3 volts, then 2.5 volts, and so on. Voltage levels of 1.8 volts or less are now supported by many integrated circuits.

At the same time, the operating frequencies expected from the circuits have been increasing at a rapid rate. Where once 10 megahertz was considered an acceptable clock rate, clock rates of up to 300 megahertz are now commonly specified. Integrated circuit designers are being forced to redesign many common circuits to obtain additional performance at lower voltage levels.

Therefore, it is desirable to provide high-speed flip-flops, particularly set and/or reset flip-flops, that function reliably at reduced voltage levels.

SUMMARY OF THE INVENTION

The invention provides flip-flops that are both operable at high speed and reliable at low voltage levels.

According to a first aspect of the invention, a first flip-flop includes first and second latches. When a clock signal is in a first state, a data input signal is passed to a first node of the first latch through a first passgate, and the inverted data input signal is passed to a second node of the first latch through a second passgate. When the clock signal is in a second state, a signal on the second node of the first latch is passed to a first node of the second latch through a third passgate, and the inverse of that signal is passed to a second node of the second latch through a fourth passgate.

In one embodiment, the first, second, third, and fourth passgates are N-channel transistors. CMOS passgates are used in one embodiment. However, they are not necessary in most cases, because whenever a high value is passed to one node of a latch, a low value is passed to the other node of the latch. Therefore, the latch can safely ignore all high input values. Hence, this feature permits the flip-flops of the invention to function at very low voltages. Because writing a high value is normally much slower than writing a low value, the flip-flops of the invention also function at very high clock rates, even at low voltages.

In some embodiments, means are provided for disabling the feedback loops of each latch while data is passed to the latch. The first latch comprises first and second logic gates, with the first logic gate driving the first node and the second logic gate, and the second logic gate driving the second node and the first logic gate. The second latch also comprises first and second logic gates, with the first logic gate driving the first node and the second logic gate, and the second logic gate driving the second node and the first logic gate.

In one such embodiment, a feedback passgate is coupled between an output terminal of the first logic gate and the first node of each latch. The N-channel gate terminal of the feedback passgate in the first latch is coupled to the gate terminal of the first passgate. The P-channel gate terminal (where provided) is coupled to receive the inverse signal from the N-channel gate terminal. The N-channel gate terminal of the feedback passgate in the second latch is coupled to the gate terminal of the second passgate. The P-channel gate terminal (where provided) is coupled to receive the inverse signal from the N-channel gate terminal.

In another such embodiment, an N-channel transistor is inserted into the pull-down path of the first logic gate of each latch. Thus, when the N-channel transistor is "off", the logic gate does not pull the first node of the latch low, and a high value is easily written to the latch.

A second aspect of the invention enables the use of cross-coupled inverters, rather than NAND gates and NOR gates, to implement set, reset, and set/reset flip-flops. Because inverters are faster than similarly-sized NAND and NOR gates, this features also increases the speed at which the flip-flop can operate.

In a flip-flop according to this aspect of the invention, a first latch comprises first and second inverters, with the first inverter driving the first node and the second inverter, and the second inverter driving the second node and the first inverter. The second latch also comprises first and second inverters, with the first inverter driving the first node and the second inverter, and the second inverter driving the second node and the first inverter. For each latch, at least one pull-up and at least one pull-down are coupled directly to the nodes of the latch. The pull-ups and pull-downs are controlled by set and/or reset signals applied to the flip-flop.

In a reset flip-flop according to one embodiment of the invention, a first pull-down is coupled to the first node of the first latch, with the gate terminal of the first pull-down being driven by a reset signal. A first pull-up is coupled to the first node of the second latch, with the gate terminal of the first pull-up being driven by an inverted reset signal. Optionally, a second pull-up is coupled to the second node of the first latch, with the gate terminal of the second pull-up being driven by the inverted reset signal, and a second pull-down is coupled to the second node of the second latch, with the gate terminal of the second pull-down being driven by the reset signal.

In a set flip-flop according to another embodiment of the invention, a third pull-up is coupled to the first node of the first latch, with the gate terminal of the third pull-up being driven by an inverted set signal. A third pull-down is coupled to the first node of the second latch, with the gate terminal of the third pull-down being driven by the set signal. Optionally, a fourth pull-down is coupled to the second node of the first latch, with the gate terminal of the fourth pull-down being driven by the set signal, and a fourth pull-up is coupled to the second node of the second latch, with the gate terminal of the fourth pull-up being driven by the inverted set signal.

In a set/reset flip-flop according to yet another embodiment of the invention, all of the above-mentioned first and second pull-ups and pull-downs are included. In another embodiment, all of the first, second, third, and fourth pullups and pull-downs are included. In another embodiment, only the third and fourth pull-ups and pull-downs are included. For all of the set/reset flip-flops of the invention, the set and reset signals are preferably restricted such that at most one of them can be active at any given time.

According to a third aspect of the invention, both the first and second aspects are applied. In other words, when an input signal is applied to one terminal of each latch, an inverted input signal is applied to the other terminal of the same latch. In addition, set and/or reset capability is provided by coupling at least one pull-up and at least one pull-down directly to the nodes of the latch. Thus, set and/or reset flip-flops are provided having the advantages of both high speed and the ability to function properly at very low power levels.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of electronic circuits. The present invention has been found to be particularly applicable and beneficial when applied to flip-flops implemented in integrated circuits using CMOS processing technology. While the present invention is not so limited, an appreciation of the present invention is presented by way of specific examples implemented in CMOS integrated circuits. Further, numerous specific details are set forth to provide a more thorough understanding of the present invention. However, it will be apparent to one skilled in the art that the present invention may be practiced without these specific details.

Figure 5:
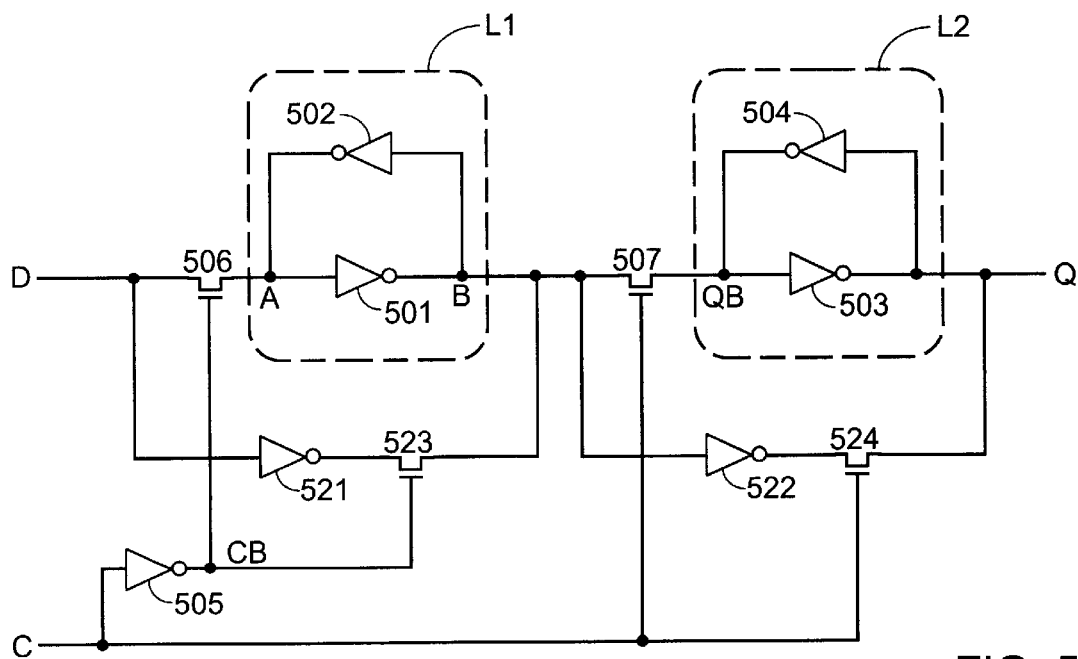
FIG. 5 is a circuit diagram of a flip-flop according to one embodiment of the invention, in which N-channel transistors are used as passgates.

FIG. 5 shows a first flip-flop according to one embodiment of the invention. The flip-flop includes two latches L1, L2, each comprising two cross-coupled logic gates. In this embodiment, the logic gates are inverters; however, other gates can be used in other embodiments where additional input signals are provided.

A first passgate 506 is coupled between a data input terminal D and a first node A in the first latch L1. Passgate 506 is turned on when inverted clock signal CB is high. (Clock signal C is inverted using inverter 505 to provide inverted clock signal CB.) An inverter 502 drives node A, and also drives an inverter 501, which in turn drives a second node B and inverter 502.

A second passgate 507 is coupled between node B and a third node QB in the second latch L2. Passgate 507 is turned on when clock signal C is high. An inverter 504 drives node QB, and also drives an inverter 503, which in turn drives node Q and inverter 504. One or both of nodes Q and QB are provided to output terminals of the flip-flop.

In this embodiment, passgates 506 and 507 are implemented using N-channel transistors.

Unlike previously-known flip-flops, the flip-flop of FIG. 5 also inverts a data signal on data input terminal D using inverter 521, and provides the inverted signal through passgate 523 to node B when inverted clock signal CB is high. Similarly, a data signal on node B is inverted using inverter 522, and provided through passgate 524 to node Q when clock signal C is high. Because both true and complement (inverted) data values are provided to each latch, writing high values to the latches is no more difficult than writing low values. Therefore, the flip-flop of FIG. 3 functions at very low voltages compared to known flip-flops.

Figure 6:
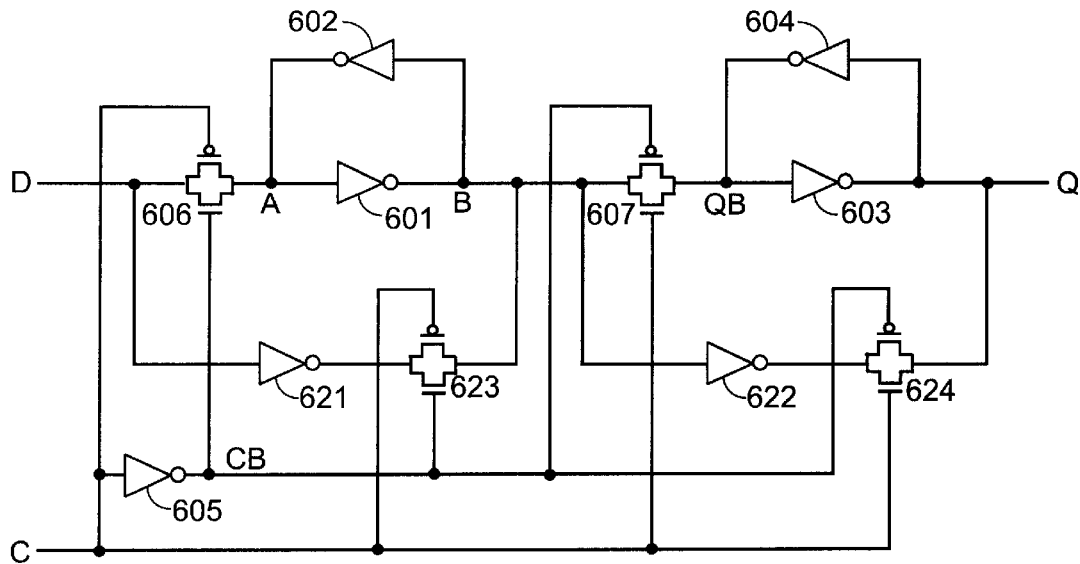
FIG. 6 is a circuit diagram of a flip-flop according to one embodiment of the invention, in which CMOS passgates are used.

FIG. 6 shows a second flip-flop according to another embodiment of the invention. This embodiment is similar to that of FIG. 5; therefore, only the differences are described. In this embodiment, passgates 506, 507, 523, and 524 are replaced by CMOS passgates 606, 607, 623, and 624.

A CMOS passgate includes an N-channel transistor and a P-channel transistor coupled in parallel. Therefore, the N-channel gate terminals are coupled the same way as the N-channel transistor passgates in FIG. 5. Each P-channel gate terminal is coupled to receive the opposite signal from the corresponding N-channel gate terminal. Therefore, both transistors in a CMOS passgate are either on or off at the same time. However, the P-channel transistor, while slower than the N-channel transistor, passes a high value without lowering the voltage level.

Figure 7:
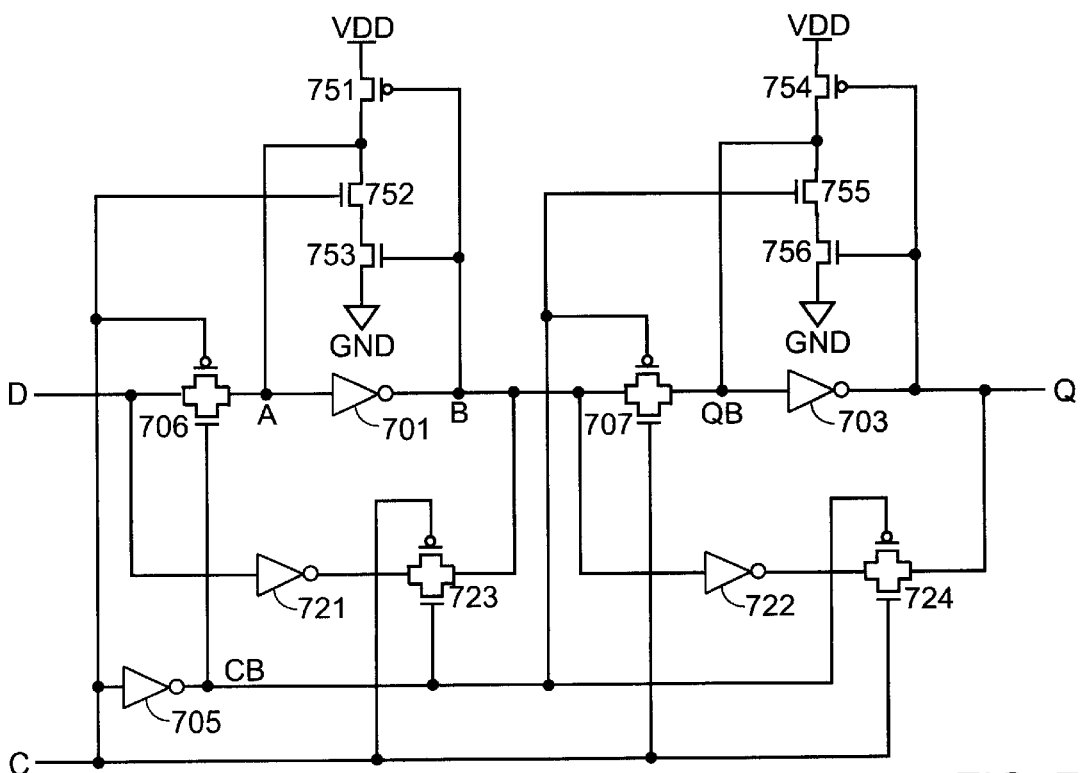
FIG. 7 is a circuit diagram of a flip-flop according to one embodiment of the invention, in which CMOS passgates are used and the feedback inverters of each latch cannot drive a low value when writing to the latch.

FIG. 7 shows a third flip-flop according to yet another embodiment of the invention. This embodiment is similar to that of FIG. 6, except that N-channel transistors 752, 755 are inserted in the pull-down paths of inverters 602 and 604, respectively. (P-channel transistor 751 and N-channel transistor 753 correspond to inverter 602, and P-channel transistor 754 and N-channel transistor 756 correspond to inverter 604.) Each of transistors 752, 755 is coupled such that when data is being written to the corresponding latch, the feedback inverter cannot drive a low value. For example, when passgate 706 is turned on to pass a value from data input terminal D to node A, N-channel transistor 752 is turned off. Thus, a high value on data input terminal D is easily written to the first latch.

Figure 8:
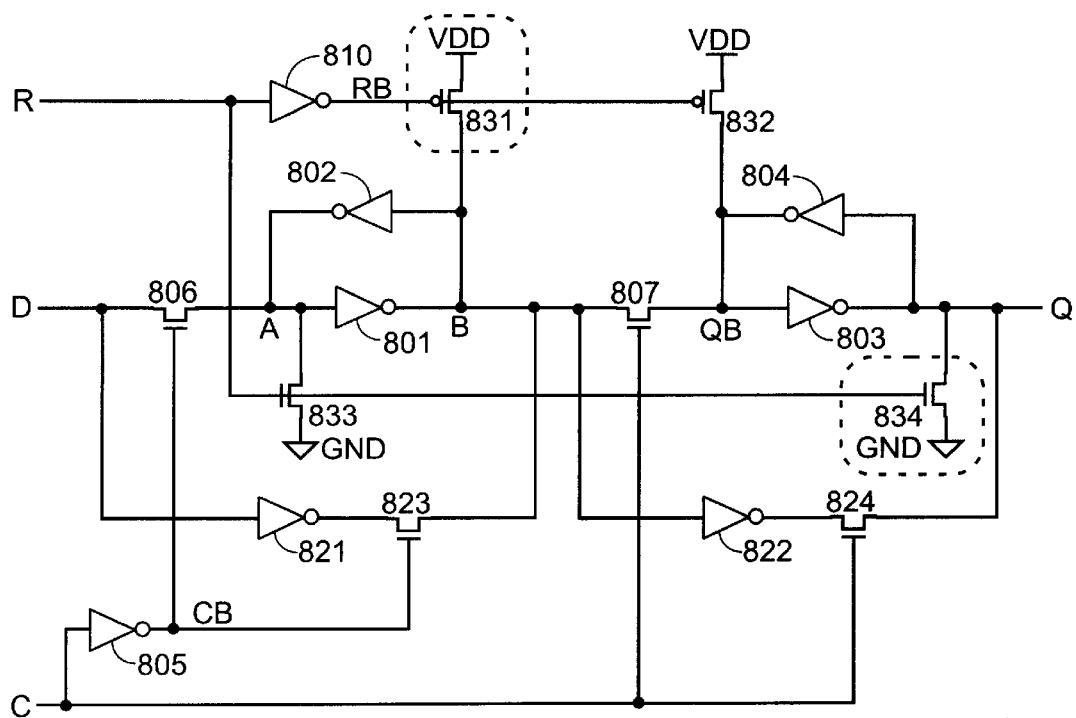
FIG. 8 is a circuit diagram of a first high-speed, low-power reset flip-flop according to one embodiment of the invention.

FIG. 8 shows a first reset flip-flop according to one embodiment of the invention. The flip-flop of FIG. 8 is similar to that of FIG. 5, except that pull-ups and pull-downs are coupled to the latch nodes to directly control the values stored in the latches. A reset signal R is provided, and inverted in inverter 810 to generate inverted reset signal RB.

In one embodiment (not shown) inverter 805 is replaced by a 2-input NOR gate driven by reset signal R and clock signal C. Thus, whenever the reset signal R is active (high), signal CB is low, and there is no attempt to write new data to the flip-flop.

A pull-up 832 is coupled to node QB, in this embodiment a P-channel transistor gated by inverted reset signal RB. A pull-down 833 is coupled to node A, in this embodiment an N-channel transistor gated by reset signal R. Thus, when reset signal R goes high, node A goes low, node B goes high (driven by inverter 801), node QB goes high, and node Q goes low (driven by inverter 803). Thus, the flip-flop is reset and the new values are stored in the latches.

Optionally, a second pull-up 831 is coupled to node B, in this embodiment a P-channel transistor gated by inverted reset signal RB, and a second pull-down 834 is coupled to node Q. in this embodiment an N-channel transistor gated by reset signal R. (In FIGS. 8–13, optional elements are shown encircled by dotted lines.) The addition of these optional devices causes the reset signal to operate more quickly to reset the flip-flop, because the new values do not need to propagate through inverters 801 and 803.

In another embodiment of the invention (not shown), pull-up 831 and pull-down 834 are included, while pull-up 832 and pull-down 833 are omitted. However, this is not the preferred embodiment when current CMOS technology is used to implement the invention. Because inverters 802 and 804 need to be easily overcome by new data written to the latches, these inverters are typically made relatively weak. Inverters 801 and 803, however, are often made stronger. Hence, pull-downs and pull-ups on the outputs of inverters 801 and 803 generally need to be stronger (e.g., larger and/or slower) to overcome the strong inverters. Therefore, pull-ups and pull-downs on the outputs of the weaker inverters are preferred.

Figure 1:
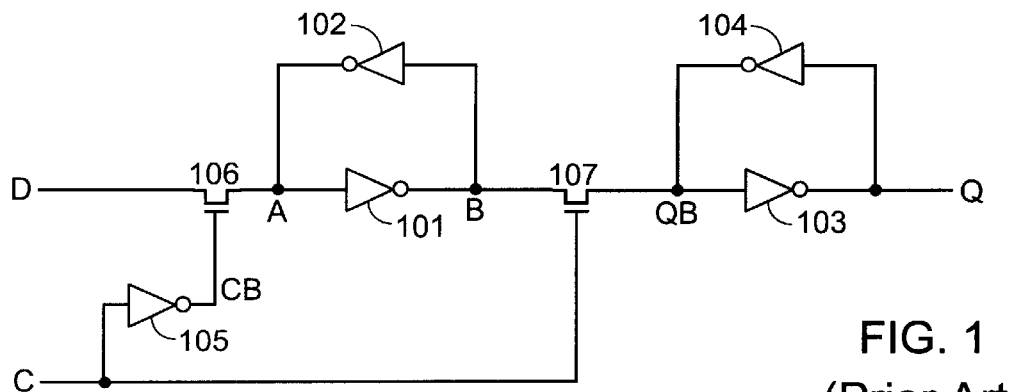
FIG. 1 is a circuit diagram of a prior art flip-flop using N-channel transistors as passgates.
Figure 2A:
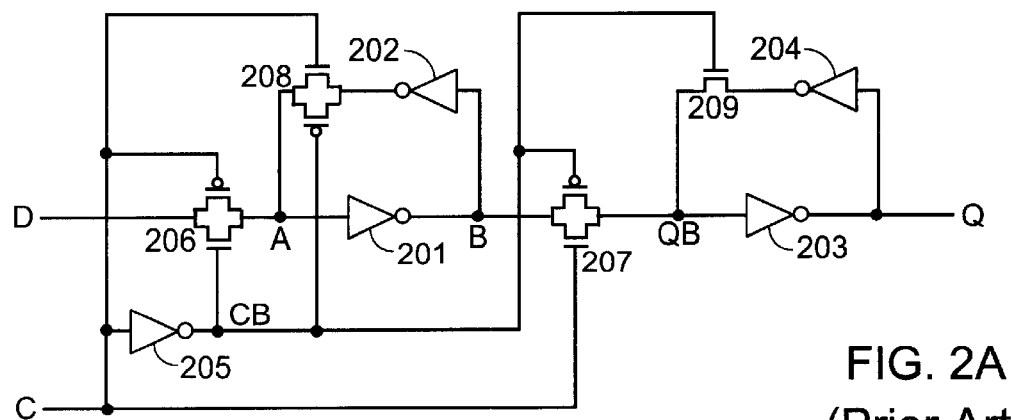
FIG. 2A is a circuit diagram of a prior art flip-flop using CMOS passgates.
Figure 2B:
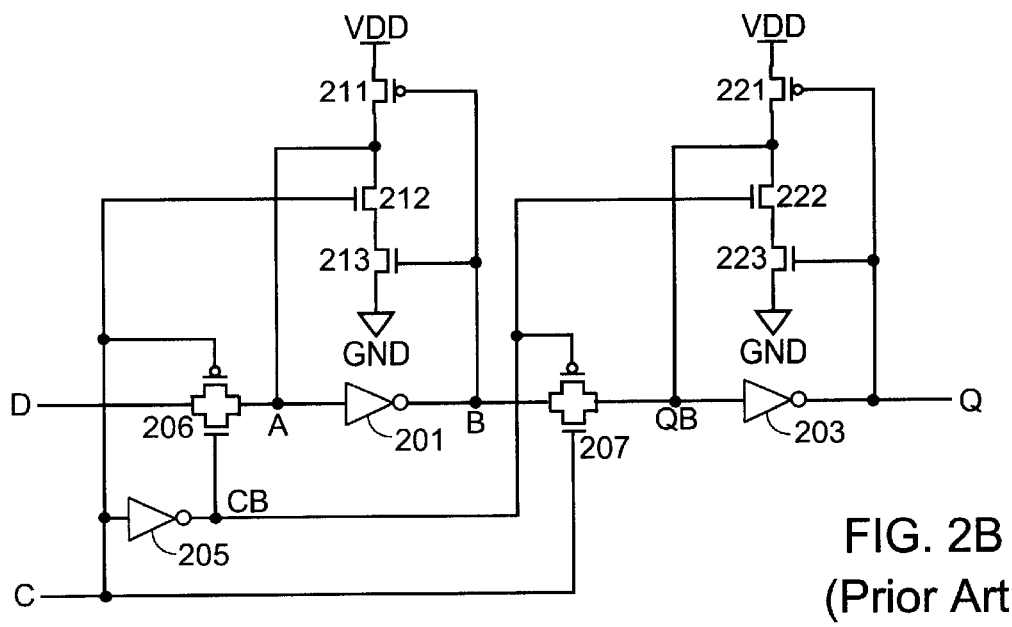
FIG. 2B is a circuit diagram of a prior art flip-flop using N-channel transistors as additional pull-downs.
Figure 3:
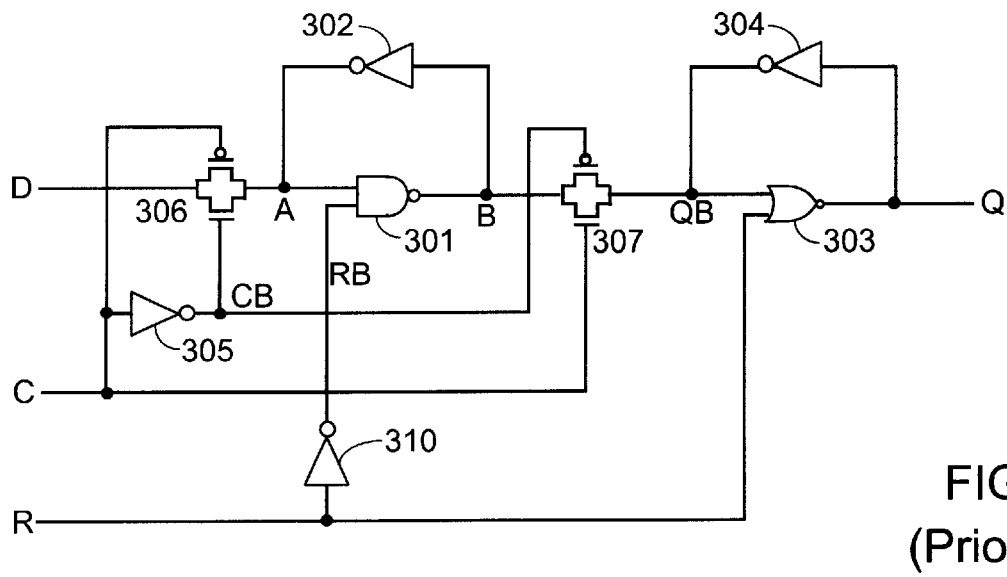
FIG. 3 is a circuit diagram of a prior art reset flip-flop.
Figure 3A:
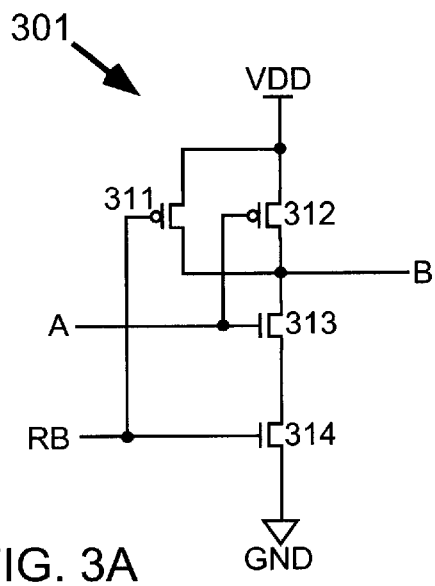
FIG. 3A is a circuit diagram of a prior art CMOS NAND gate.
Figure 3B:
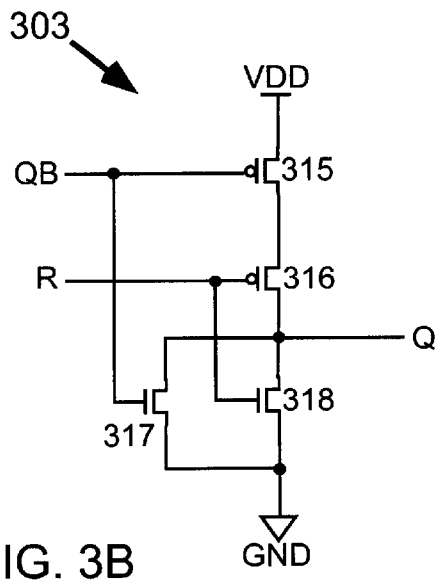
FIG. 3B is a circuit diagram of a prior art CMOS NOR gate.
Figure 4:
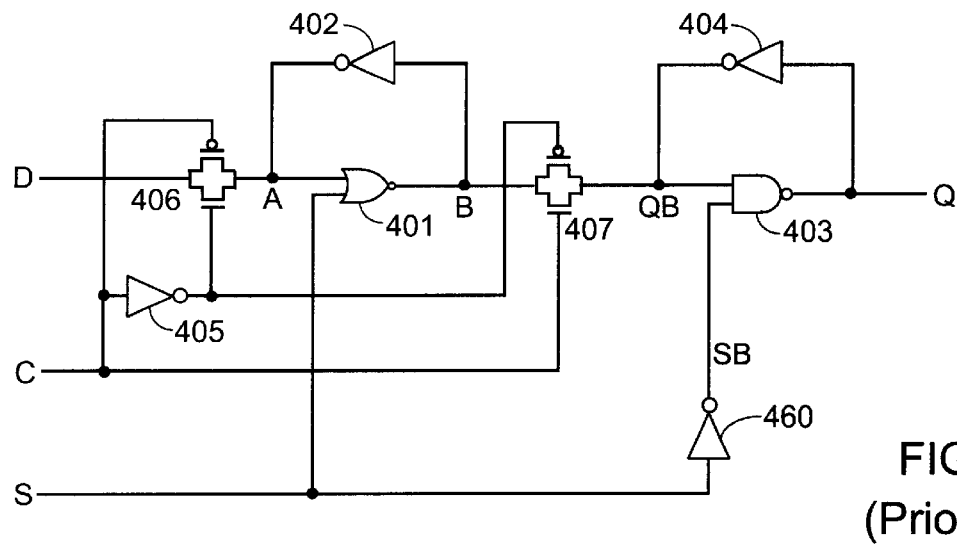
FIG. 4 is a circuit diagram of a prior art set flip-flop.

Comparing the reset flip-flop of FIG. 8 to the prior art reset flip-flop shown in FIG. 3, it can be seen that the need for NAND and NOR gates to implement the reset function is eliminated. Because inverters are faster than similarly-sized NAND and NOR gates, this features also increases the speed at which the flip-flop can operate. Also, an inverter with a pull-up or pull-down coupled to the output node has fewer transistors than a CMOS NAND or NOR gate (see FIGS. 3A and 3B), which also decreases the size of the resulting circuit. Flip-flops are used by the hundreds of thousands in many popular integrated circuits; therefore, size is an important factor when designing flip-flops.

Figure 9:
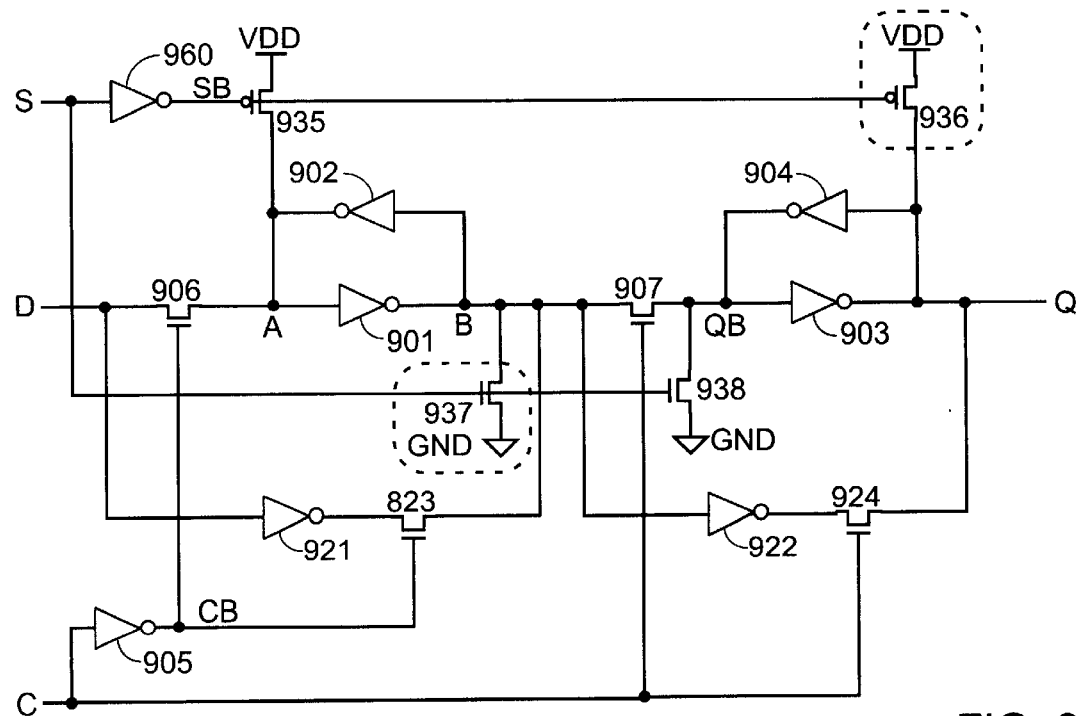
FIG. 9 is a circuit diagram of a first high-speed, low-power set flip-flop according to one embodiment of the invention.

FIG. 9 shows a first set flip-flop according to another embodiment of the invention. The set flip-flop of FIG. 9 is similar to the reset flip-flop of FIG. 8, except that the pull-ups and pull-downs are located on the opposite nodes of each latch. A set signal S is provided, and inverted in inverter 960 to generate inverted set signal SB.

Similar to the reset flip-flop of FIG. 8, inverter 905 can optionally be replaced by a 2-input NOR gate driven by set signal S and clock signal C. Thus, whenever the set signal S is active (high), signal CB is low, and there is no attempt to write new data to the flip-flop.

A pull-up 935 is coupled to node A, in this embodiment a P-channel transistor gated by inverted set signal SB. A pull-down 938 is coupled to node QB, in this embodiment an N-channel transistor gated by set signal S. Thus, when set signal S goes high, node A goes high, node B goes low (driven by inverter 901), node QB goes low, and node Q goes high (driven by inverter 903). Thus, the flip-flop is set and the new values are stored in the latches.

Optionally, a second pull-up 936 is coupled to node Q, in this embodiment a P-channel transistor gated by inverted set signal SB, and a second pull-down 937 is coupled to node B, in this embodiment an N-channel transistor gated by set signal S. The addition of these optional devices causes the set signal to operate more quickly to set the flip-flop, because the new values do not need to propagate through inverters 901 and 903.

In another embodiment of the invention (not shown), pull-up 936 and pull-down 937 are included, while pull-up 935 and pull-down 938 are omitted. However, for the reasons given above relative to the embodiment of FIG. 8, this is not the preferred embodiment when current CMOS technology is used to implement the invention.

Figure 10:
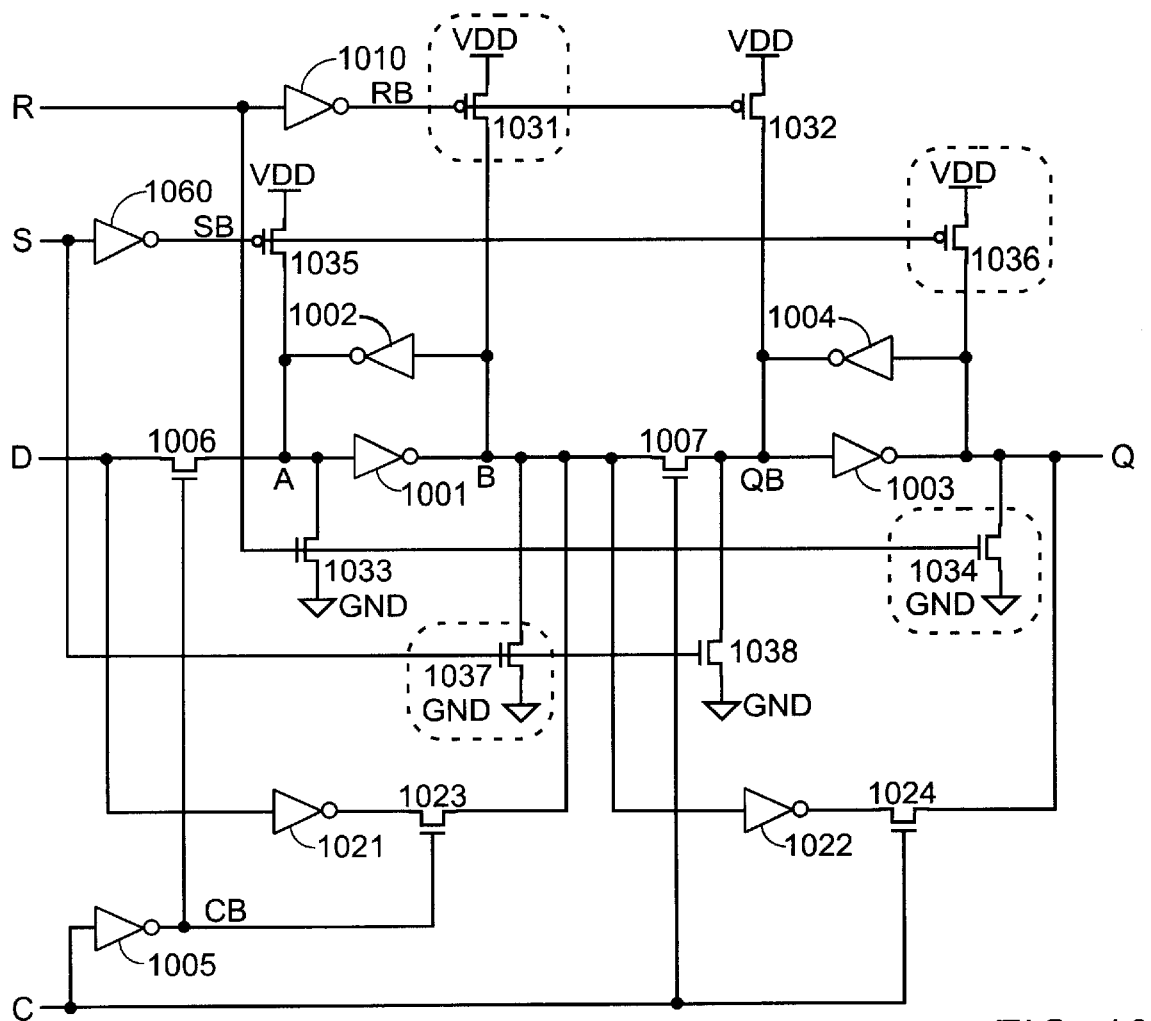
FIG. 10 is a circuit diagram of a first high-speed, low-power set/reset flip-flop according to one embodiment of the invention.

FIG. 10 shows a first set/reset flip-flop according to another embodiment of the invention. The flip-flop of FIG. 10 is similar to that of FIGS. 8 and 9, incorporating all of the pull-ups and pull-downs coupled to the latch nodes in the flip-flops shown in these figures. Therefore, the flip-flop of FIG. 10 has both set and reset capability.

Similar to the reset and set flip-flops of FIGS. 8 and 9, inverter 1005 can optionally be replaced by a 3-input NOR gate driven by set signal S, reset signal R, and clock signal C. Thus, whenever the flip-flop is either set or reset, there is no attempt to write new data to the flip-flop.

Figure 11:
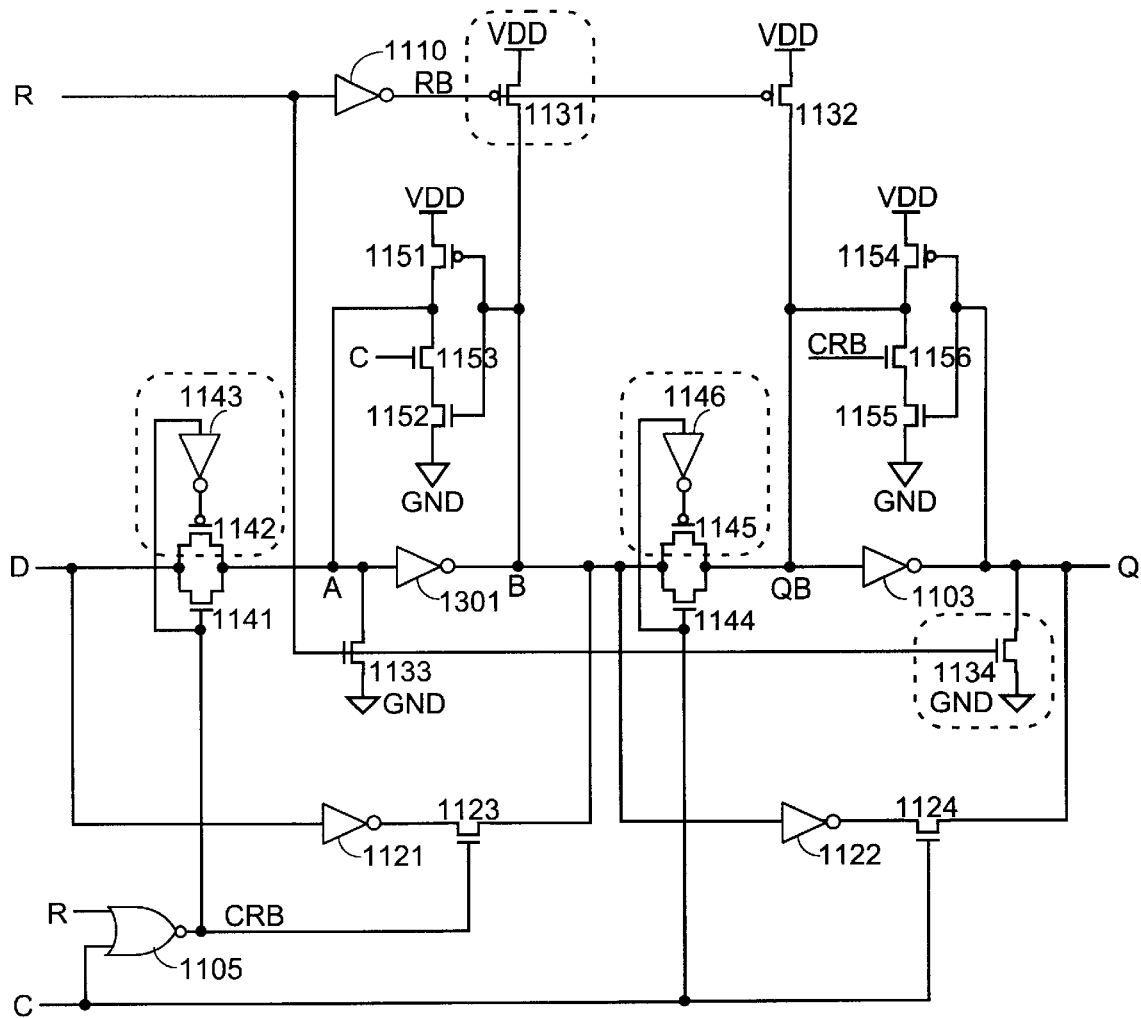
FIG. 11 is a circuit diagram of a second high-speed, low-power reset flip-flop according to one embodiment of the invention.

FIG. 11 shows a second reset flip-flop according to another embodiment of the invention. The flip-flop of FIG. 11 is similar to that of FIG. 8, but differs in the following ways.

Passgate 806 is replaced by a CMOS passgate comprising N-channel transistor 1141, P-channel transistor 1142, and inverter 1143. Note that P-channel transistor 1142 and inverter 1143 can optionally be removed (as shown by the dotted line encircling these elements), leaving only N-channel transistor 1141. Similarly, passgate 807 is replaced by a CMOS passgate comprising N-channel transistor 1144, P-channel transistor 1145, and inverter 1146. P-channel transistor 1145 and inverter 1146 can optionally be removed, leaving only N-channel transistor 1144.

Note also that in the embodiment of FIG. 11, the reset signal R and the clock signal C are combined in NOR gate 1105 to generate the inverted clock/reset signal CRB. The inclusion of the reset signal in the inverted clock/reset signal CRB (rather than using the inverted clock signal as in the flip-flop of FIG. 8) ensures that there is no attempt to write new data to the flip-flop during the reset process. For this reason, the reset pull-down 1133 on node A does not need to be sized to overcome a simultaneous attempt to pass a high value into the first latch from data input terminal D.

In a fashion similar to the embodiment of FIG. 7, N-channel transistors 1153, 1156 are inserted into the pull-down paths of the feedback inverters in each latch, thus preventing the feedback inverters from driving a low value when writing to the latch. In the embodiment shown, the N-channel transistors are inserted next to the output node, to more rapidly disable the pull-down path when the clock changes state. However, in other embodiments the N-channel transistors are inserted between the inverter pull-downs (e.g., N-channel transistors 1152, 1155) and ground.

Figure 11A:
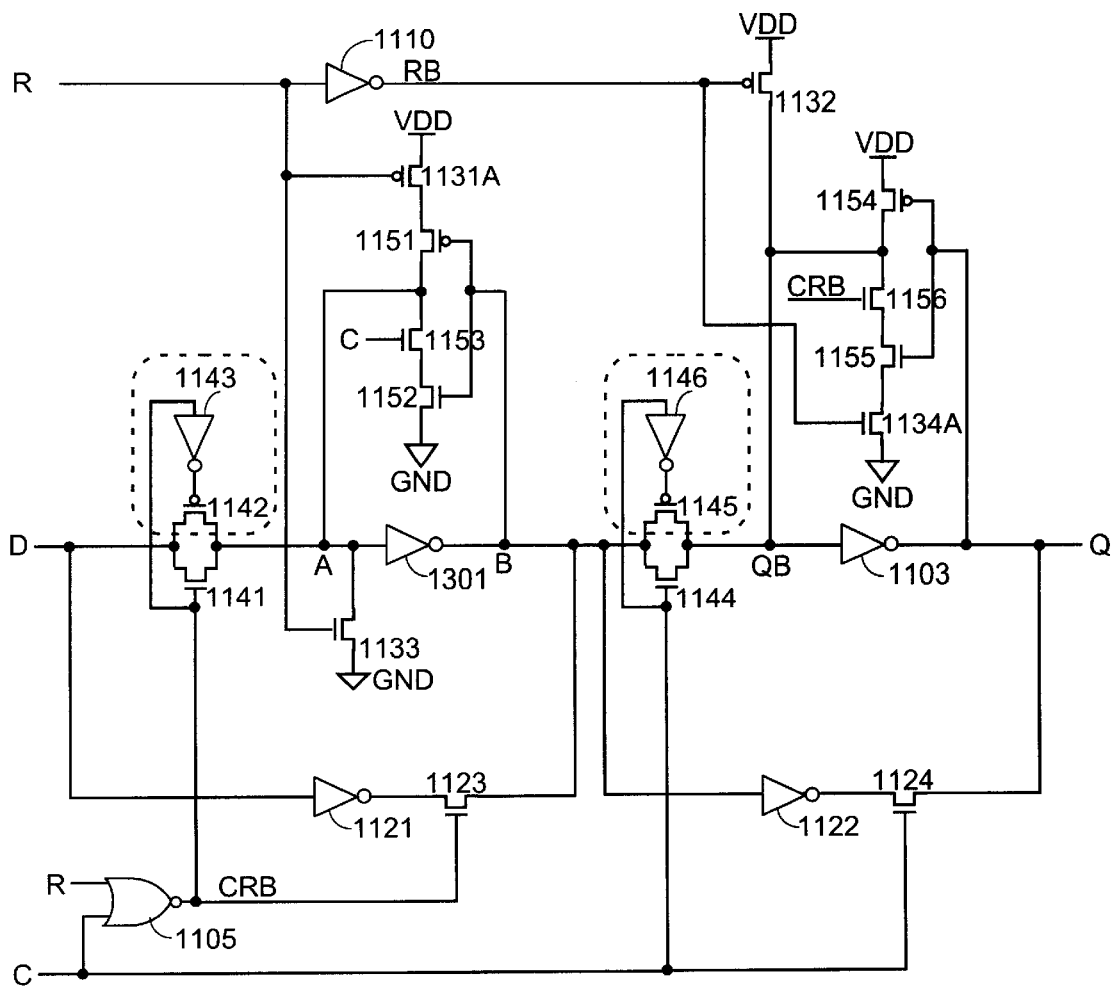
FIG. 11A is a circuit diagram of another version of the second high-speed, low-power reset flip-flop according to one embodiment of the invention.

FIG. 11A shows another reset flip-flop similar to that of FIG. 11. The reset flip-flop of FIG. 11A includes a P-channel transistor 1131A. This implementation has an advantage over that of FIG. 11. During the reset cycle (i.e., when R is high), N-channel transistor 1133 is on and P-channel transistor 1131A is off. Therefore, there is nothing pulling up on node A and opposing the pull-down 1133. Hence, N-channel transistor 1133 can be made a minimum size. In the embodiment of FIG. 11, N-channel transistor 1133 must be made large enough to overcome pull-up 1151.

The flip-flop of FIG. 11A also includes an N-channel transistor 1134A. This implementation also permits the use of a minimum-sized transistor for N-channel transistor 1132.

In other embodiments, transistors 1131A and 1134A are not placed next to the power or ground terminals, but next to the node or (in the case of transistor 1134A) between transistors 1156 and 1155.

Figure 12:
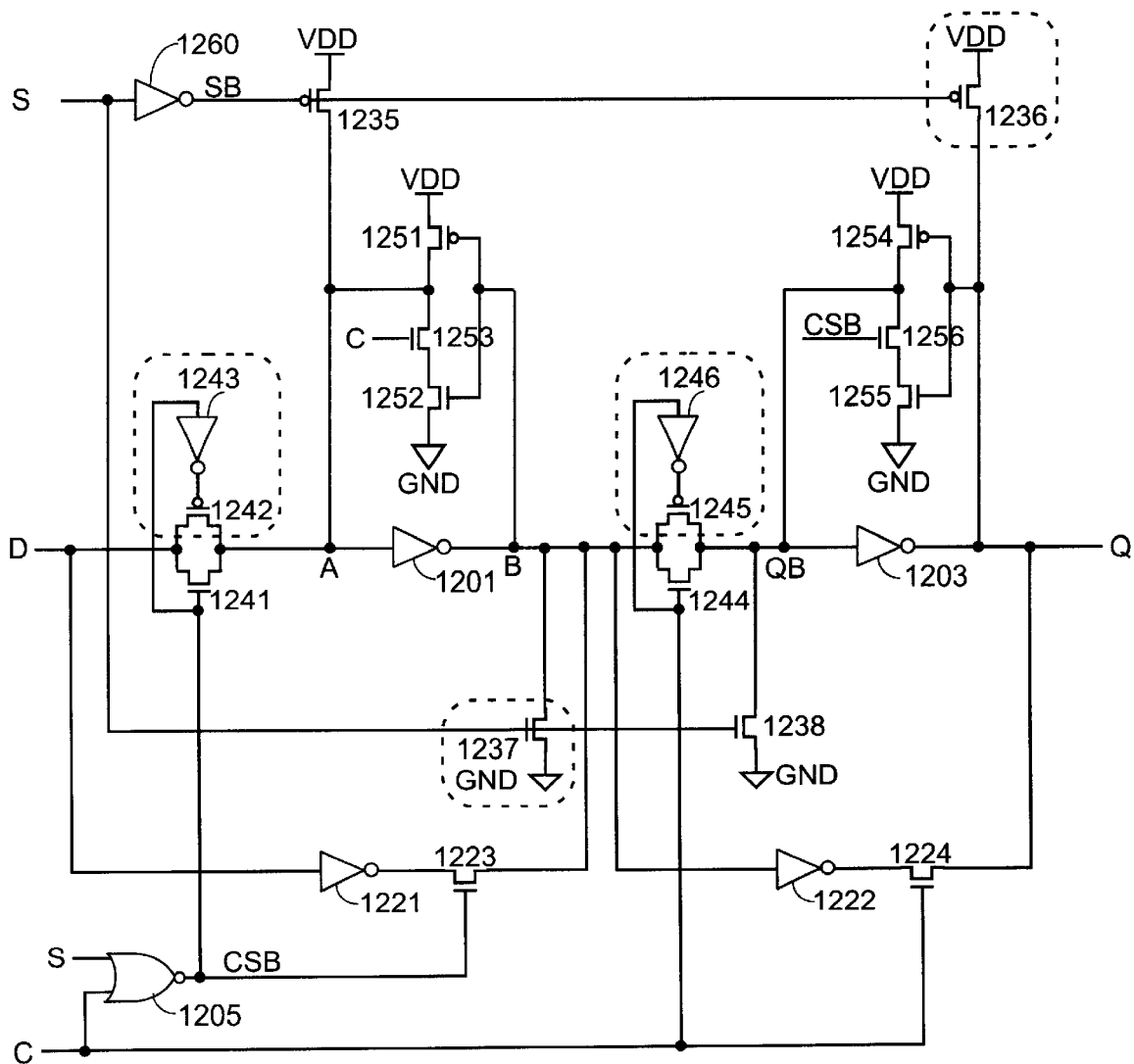
FIG. 12 is a circuit diagram of a second high-speed, low-power set flip-flop according to one embodiment of the invention.

FIG. 12 shows a second set flip-flop according to another embodiment of the invention. The set flip-flop of FIG. 12 is similar to the reset flip-flop of FIG. 11, except that the pull-ups and pull-downs are located on the opposite nodes of each latch, similar to those of FIG. 9. In the pictured embodiment, the set signal S and the clock signal C are combined in NOR gate 1205 to generate the inverted clock/ set signal CSB.

Figure 12A:
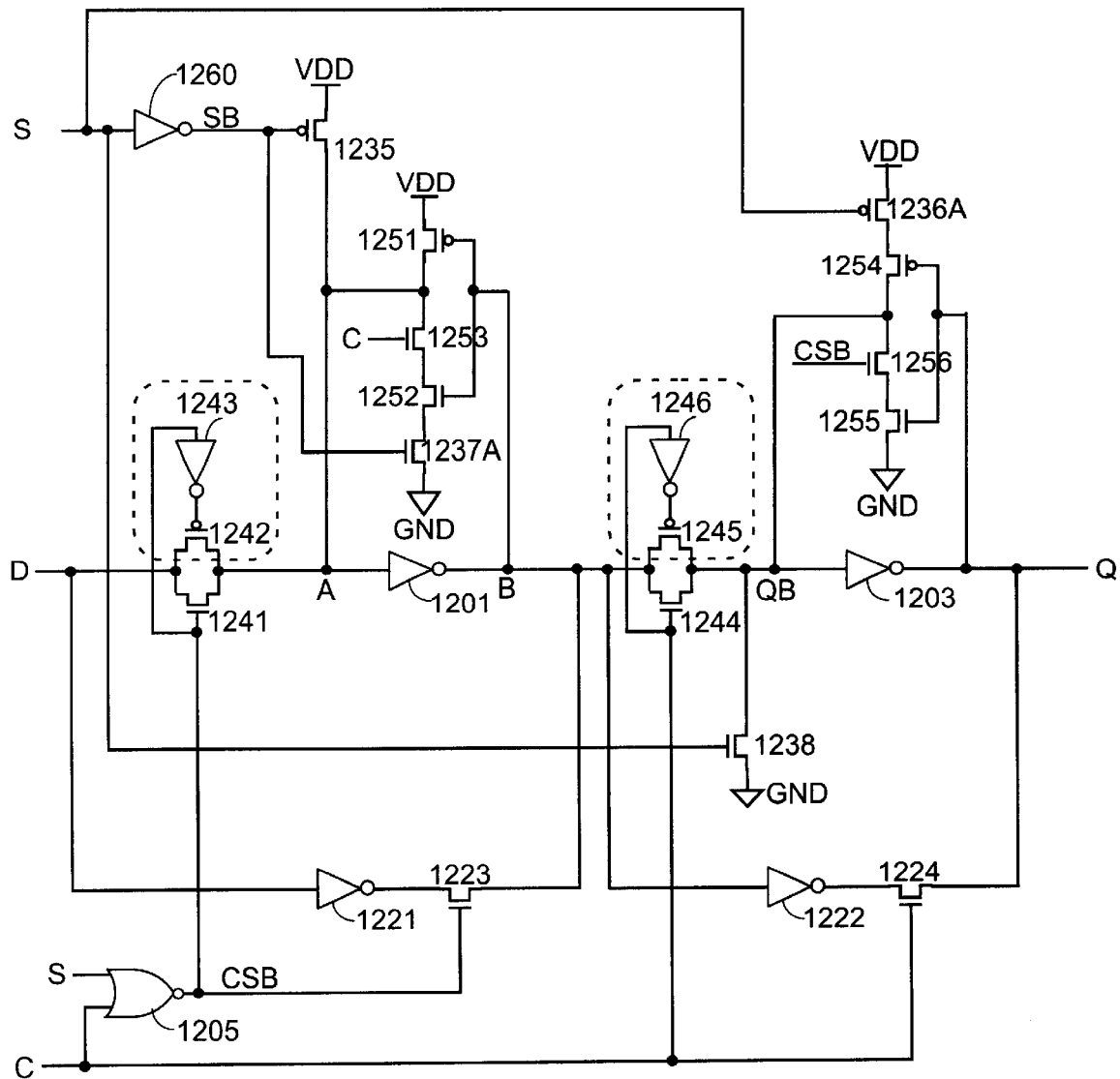
FIG. 12A is a circuit diagram of another version of the second high-speed, low-power set flip-flop according to one embodiment of the invention.

FIG. 12A shows another set flip-flop similar to that of FIG. 12. The set flip-flop of FIG. 12A includes an N-channel transistor 1237A. The flip-flop also includes a P-channel transistor 1236A. Transistors 1237A and 1236A have advantages similar to those of transistors 1131A and 1134A, as described above.

Figure 13:
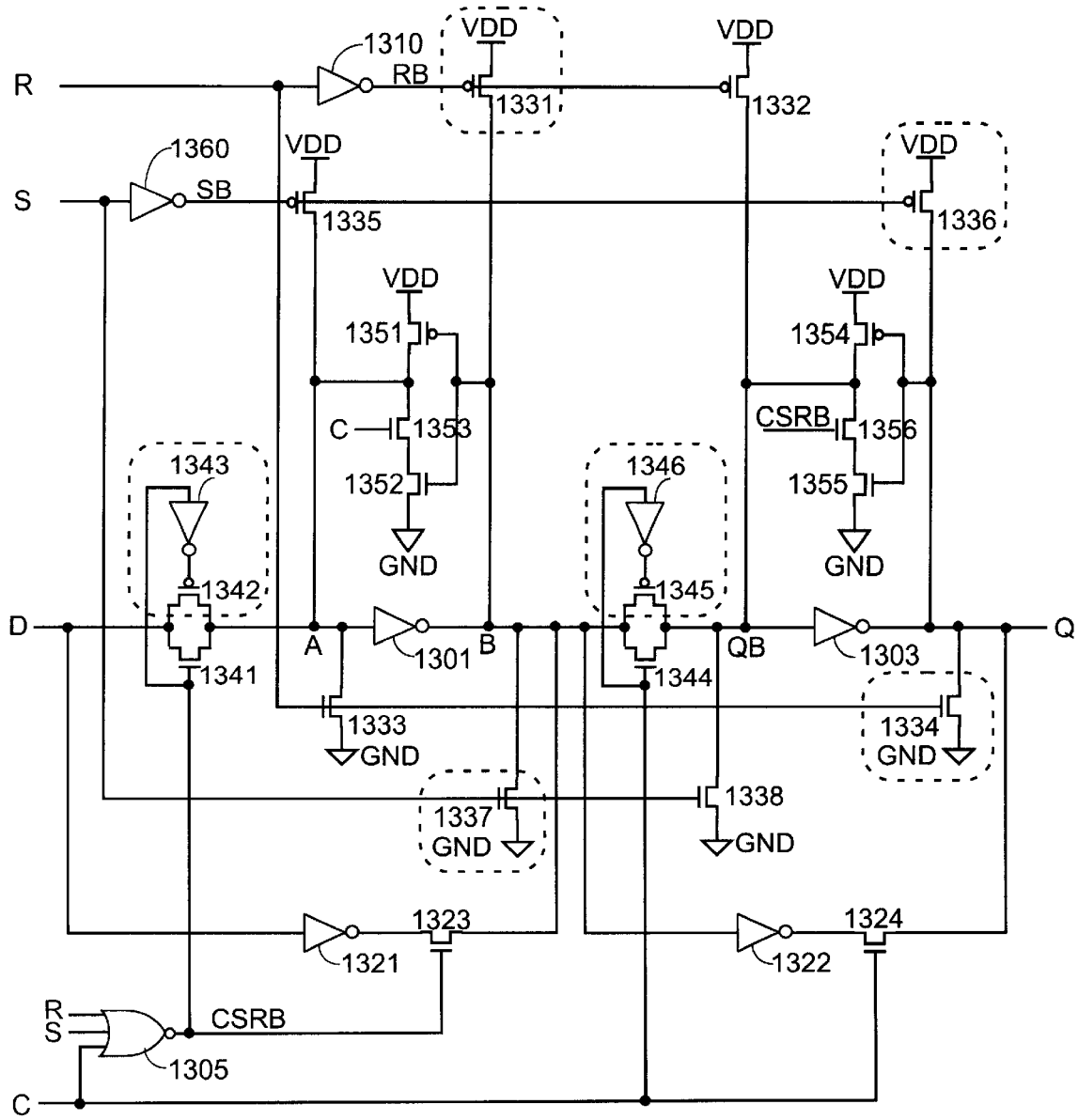
FIG. 13 is a circuit diagram of a second high-speed, low-power set/reset flip-flop according to one embodiment of the invention.

FIG. 13 shows a second set/reset flip-flop according to another embodiment of the invention. The flip-flop of FIG. 13 is similar to that of FIGS. 11 and 12, incorporating all of the pull-ups and pull-downs coupled to the latch nodes in the flip-flops shown in these figures. Therefore, the flip-flop of FIG. 13 has both set and reset capability.

In the pictured embodiment, set signal S, reset signal R, and the clock signal C are combined in 3-input NOR gate 1305 to generate the inverted clock/set/reset signal CSRB. In another embodiment (not shown), 3-input NOR gate 1305 is implemented as a 2-input NAND gate driven by inverted set signal SB and inverted reset signal RB, and a 2-input NOR gate driven by the NAND gate and clock signal C. The 2-input NOR gate provides inverted clock/set/reset signal CSRB. This implementation improves the speed of writing to the flip-flop (with the clock signal) at the expense of slowing the set and reset processes.

Figure 14:
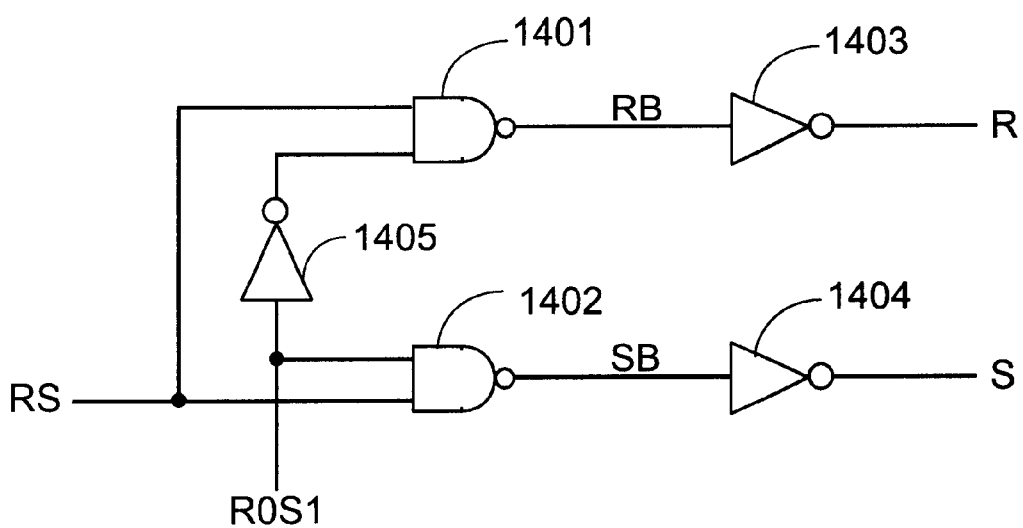
FIG. 14 shows a circuit for generating set and reset signals that can be used with a set/reset flip-flop according to the invention.

As described above, it is common for set/reset flip-flops to require that the set and reset signals be mutually exclusive, i.e., that signals S and R not both be active at the same time. FIG. 14 shows a simple circuit that can be used to guarantee non-overlapping set and reset signals.

The circuit of FIG. 14 comprises NAND gates 1401–1402 and inverters 1403–1405. There are two input signals, RS and R0S1, and two output signals, the set and reset signals S and R. NAND gate 1401 is driven by input signal RS and the inverse of input signal R0S1 (inverted by inverter 1405), and provides inverted reset signal RB, which is inverted by inverter 1403 to provide reset signal R. NAND gate 1402 is driven by input signals RS and R0S1, and provides inverted set signal SB, which is inverted by inverter 1404 to provide set signal S.

When input signal R0S1 is low, the RS input signal acts as a reset signal. When input signal R0S1 is high, the RS input signal acts as a set signal. Clearly, the R and S signals are not high at the same time, because R0S1 is either high or low, but not simultaneously both high and low.

Those having skill in the relevant arts of the invention will now perceive various modifications and additions that may be made as a result of the disclosure herein. For example, latches, logic gates, inverters, NAND gates, NOR gates, passgates, transistors, pull-ups, and pull-downs other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A flip-flop circuit, comprising:
   a flip-flop data input terminal;
   a flip-flop output terminal;
   a first clock terminal providing a first clock signal;
   a second clock terminal providing a second clock signal, the second clock signal being an inverse of the first clock signal;
   first, second, third, and fourth nodes;
   a first passgate coupled between the data input terminal and the first node, a gate terminal of the first passgate being coupled to the second clock terminal;
   a first latch comprising a first logic gate having an input terminal coupled to the second node and an output terminal coupled to the first node, and a second logic gate having an input terminal coupled to the first node and an output terminal coupled to the second node;
   a second passgate coupled between the second node and the third node, a gate terminal of the second passgate being coupled to the first clock terminal;
   a second latch comprising a third logic gate having an input terminal coupled to the fourth node and an output terminal coupled to the third node, and a fourth logic gate having an input terminal coupled to the third node and an output terminal coupled to the fourth node;
   a first inverter having an input terminal coupled to the flip-flop data input terminal, and an output terminal;
   a third passgate coupled between the output terminal of the first inverter and the second node, a gate terminal of the third passgate being coupled to the second clock terminal;
   a second inverter having an input terminal coupled to the second node, and an output terminal; and
   a fourth passgate coupled between the output terminal of the second inverter and the fourth node, a gate terminal of the fourth passgate being coupled to the first clock terminal;
   wherein one of the third and fourth nodes is coupled to the flip-flop output terminal.

2. The flip-flop circuit of claim 1, wherein the first, second, third, and fourth passgates are N-channel transistors.

3. The flip-flop circuit of claim 1, wherein:
   the first passgate is a CMOS passgate having an N-channel gate terminal coupled to the second clock terminal and a P-channel gate terminal coupled to the first clock terminal; and
   the second passgate is a CMOS passgate having an N-channel gate terminal coupled to the first clock terminal and a P-channel gate terminal coupled to the second clock terminal.

4. The flip-flop circuit of claim 1, further comprising:
   a first feedback gate coupled between the output terminal of the first logic gate and the first node, with an N-channel gate terminal of the first feedback gate being coupled to the gate terminal of the first passgate; and
   a second feedback gate coupled between the output terminal of the third logic gate and the third node, with an N-channel gate terminal of the second feedback gate being coupled to the gate terminal of the second passgate.

5. The flip-flop circuit of claim 1, further comprising:
   a first N-channel transistor inserted into a pull-down path of the first logic gate, a gate terminal of the first N-channel transistor being coupled to the gate terminal of the second passgate; and
   a second N-channel transistor inserted into a pull-down path of the third logic gate, a gate terminal of the second N-channel transistor being coupled to the gate terminal of the first passgate.

6. The flip-flop circuit of claim 1, wherein the first, second, third, and fourth logic gates are inverters.

7. The flip-flop circuit of claim 1, further comprising:
   an inverting logic gate coupled between the first clock terminal and the second clock terminal.

8. The flip-flop circuit of claim 1, further comprising:
   a first reset terminal providing a first reset signal;
   a second reset terminal providing a second reset signal, the second reset signal being an inverse of the first reset signal;
   a first pull-down coupled between the first node and a ground terminal, a gate terminal of the first pull-down being coupled to the first reset terminal; and
   a first pull-up coupled between the third node and a power high terminal, a gate terminal of the first pull-up being coupled to the second reset terminal.

9. The flip-flop circuit of claim 8, further comprising:
   an inverting logic gate coupled between the first reset terminal and the second reset terminal.

10. The flip-flop circuit of claim 8, further comprising:
    a second pull-down coupled between the fourth node and the ground terminal, a gate terminal of the second pull-down being coupled to the first reset terminal; and
    a second pull-up coupled between the second node and the power high terminal, a gate terminal of the second pull-up being coupled to the second reset terminal.

11. The flip-flop circuit of claim 8, further comprising:
a NOR gate having a first input terminal coupled to the first reset terminal, a second input terminal coupled to the first clock terminal, and an output terminal coupled to the second clock terminal.

12. The flip-flop circuit of claim 1, further comprising:
a first set terminal providing a first set signal;
a second set terminal providing a second set signal, the second set signal being an inverse of the first set signal;
a first pull-up coupled between the first node and a power high terminal, a gate terminal of the first pull-up being coupled to the second set terminal; and
a first pull-down coupled between the third node and a ground terminal, a gate terminal of the first pull-down being coupled to the first set terminal.

13. The flip-flop circuit of claim 12, further comprising:
an inverting logic gate coupled between the first set terminal and the second set terminal.

14. The flip-flop circuit of claim 12, further comprising:
a second pull-up coupled between the fourth node and the power high terminal, a gate terminal of the second pull-up being coupled to the second set terminal; and
a second pull-down coupled between the second node and the ground terminal, a gate terminal of the second pull-down being coupled to the first set terminal.

15. The flip-flop circuit of claim 12, further comprising:
a NOR gate having a first input terminal coupled to the first set terminal, a second input terminal coupled to the first clock terminal, and an output terminal coupled to the second clock terminal.

16. A reset flip-flop circuit, comprising:
a flip-flop data input terminal;
a flip-flop output terminal;
a first clock terminal providing a first clock signal;
a second clock terminal providing a second clock signal, the second clock signal being an inverse of the first clock signal;
a first reset terminal providing a first reset signal;
a second reset terminal providing a second reset signal, the second reset signal being an inverse of the first reset signal;
first, second, third, and fourth nodes;
a first passgate coupled between the data input terminal and the first node, a gate terminal of the first passgate being coupled to the second clock terminal;
a first latch comprising a first logic gate having an input terminal coupled to the second node and an output terminal coupled to the first node, and a second logic gate having an input terminal coupled to the first node and an output terminal coupled to the second node;
a second passgate coupled between the second node and the third node, a gate terminal of the second passgate being coupled to the first clock terminal;
a second latch comprising a third logic gate having an input terminal coupled to the fourth node and an output terminal coupled to the third node, and a fourth logic gate having an input terminal coupled to the third node and an output terminal coupled to the fourth node;
a first pull-down coupled between the first node and a ground terminal, a gate terminal of the first pull-down being coupled to the first reset terminal; and
a first pull-up coupled between the third node and a power high terminal, a gate terminal of the first pull-up being coupled to the second reset terminal,
wherein one of the third and fourth nodes is coupled to the flip-flop output terminal.

17. The reset flip-flop circuit of claim 16, further comprising:
an inverting logic gate coupled between the first reset terminal and the second reset terminal.

18. The reset flip-flop circuit of claim 16, further comprising:
a second pull-down coupled between the fourth node and the ground terminal, a gate terminal of the second pull-down being coupled to the first reset terminal; and
a second pull-up coupled between the second node and the power high terminal, a gate terminal of the second pull-up being coupled to the second reset terminal.

19. The reset flip-flop circuit of claim 16, further comprising:
a NOR gate having a first input terminal coupled to the first reset terminal, a second input terminal coupled to the first clock terminal, and an output terminal coupled to the second clock terminal.

20. A set flip-flop circuit, comprising:
a flip-flop data input terminal;
a flip-flop output terminal;
a first clock terminal providing a first clock signal;
a second clock terminal providing a second clock signal, the second clock signal being an inverse of the first clock signal;
a first set terminal providing a first set signal;
a second set terminal providing a second set signal, the second set signal being an inverse of the first set signal;
first, second, third, and fourth nodes;
a first passgate coupled between the data input terminal and the first node, a gate terminal of the first passgate being coupled to the second clock terminal;
a first latch comprising a first logic gate having an input terminal coupled to the second node and an output terminal coupled to the first node, and a second logic gate having an input terminal coupled to the first node and an output terminal coupled to the second node;
a second passgate coupled between the second node and the third node, a gate terminal of the second passgate being coupled to the first clock terminal;
a second latch comprising a third logic gate having an input terminal coupled to the fourth node and an output terminal coupled to the third node, and a fourth logic gate having an input terminal coupled to the third node and an output terminal coupled to the fourth node;
a first pull-up coupled between the first node and a power high terminal, a gate terminal of the first pull-up being coupled to the second set terminal; and
a first pull-down coupled between the third node and a ground terminal, a gate terminal of the first pull-down being coupled to the first set terminal,
wherein one of the third and fourth nodes is coupled to the flip-flop output terminal.

21. The set flip-flop circuit of claim 20, further comprising:
an inverting logic gate coupled between the first set terminal and the second set terminal.

22. The set flip-flop circuit of claim 20, further comprising:
a second pull-up coupled between the fourth node and the power high terminal, a gate terminal of the second pull-up being coupled to the second set terminal; and a second pull-down coupled between the second node and the ground terminal, a gate terminal of the second pull-down being coupled to the first set terminal.

23. The set flip-flop circuit of claim 20, further comprising:

a NOR gate having a first input terminal coupled to the first set terminal, a second input terminal coupled to the first clock terminal, and an output terminal coupled to the second clock terminal.

24. A set/reset flip-flop circuit, comprising:

a flip-flop data input terminal;

a flip-flop output terminal;

a first clock terminal providing a first clock signal;

a second clock terminal providing a second clock signal, the second clock signal being an inverse of the first clock signal;

a first set terminal providing a first set signal;

a second set terminal providing a second set signal, the second set signal being an inverse of the first set signal;

a first reset terminal providing a first reset signal;

a second reset terminal providing a second reset signal, the second reset signal being an inverse of the first reset signal;

first, second, third, and fourth nodes;

a first passgate coupled between the data input terminal and the first node, a gate terminal of the first passgate being coupled to the second clock terminal;

a first latch comprising a first logic gate having an input terminal coupled to the second node and an output terminal coupled to the first node, and a second logic gate having an input terminal coupled to the first node and an output terminal coupled to the second node;

a second passgate coupled between the second node and the third node, a gate terminal of the second passgate being coupled to the first clock terminal;

a second latch comprising a third logic gate having an input terminal coupled to the fourth node and an output terminal coupled to the third node, and a fourth logic gate having an input terminal coupled to the third node and an output terminal coupled to the fourth node;

a first pull-up coupled between the first node and a power high terminal, a gate terminal of the first pull-up being coupled to the second set terminal; and a first pull-down coupled between the third node and a ground terminal, a gate terminal of the first pull-down being coupled to the first set terminal, a second pull-down coupled between the first node and a ground terminal, a gate terminal of the second pull-down being coupled to the first reset terminal; and a second pull-up coupled between the third node and a power high terminal, a gate terminal of the second pull-up being coupled to the second reset terminal, wherein one of the third and fourth nodes is coupled to the flip-flop output terminal.

25. The set/reset flip-flop circuit of claim 24, further comprising:

a first inverting logic gate coupled between the first reset terminal and the second reset terminal; and a second inverting logic gate coupled between the first set terminal and the second set terminal.

26. The set/reset flip-flop circuit of claim 24, further comprising:

a third pull-up coupled between the fourth node and the power high terminal, a gate terminal of the third pull-up being coupled to the second set terminal;

a third pull-down coupled between the second node and the ground terminal, a gate terminal of the third pull-down being coupled to the first set terminal;

a fourth pull-down coupled between the fourth node and the ground terminal, a gate terminal of the fourth pull-down being coupled to the first reset terminal; and a fourth pull-up coupled between the second node and the power high terminal, a gate terminal of the fourth pull-up being coupled to the second reset terminal.

27. The set/reset flip-flop circuit of claim 24, further comprising:

a NOR gate having a first input terminal coupled to the first reset terminal, a second input terminal coupled to the first set terminal, a third input terminal coupled to the first clock terminal, and an output terminal coupled to the second clock terminal.

* * * * *